United States Patent [19]

Momodomi et al.

[11] Patent Number: 5,050,125

[45] Date of Patent: Sep. 17, 1991

[54] ELECTRICALLY ERASABLE PROGRAMMABLE READ-ONLY MEMORY WITH NAND CELLSTRUCTURE

[75] Inventors: Masaki Momodomi, Yokohama; Koichi Toita, Tokyo; Yasuo Itoh, Kawasaki; Yoshihisa Iwata; Fujio Masuoka, both of Yokohama; Masahiko Chiba, Aomori; Tetsuo Endo, Yokohama; Riichiro Shirota, Kawasaki; Ryouhei Kirisawa, Yokohama, all of Japan

[73] Assignee: Kabushiki Kaisha Toshiba, Kawasaki, Japan

[21] Appl. No.: 272,404

[22] Filed: Nov. 17, 1988

[30] Foreign Application Priority Data

Nov. 18, 1987 [JP] Japan .................................. 62-290858
May 10, 1988 [JP] Japan .................................. 63-111620
Aug. 19, 1988 [JP] Japan .................................. 63-204670

[51] Int. Cl.$^5$ .............................................. G11C 16/06
[52] U.S. Cl. ................................ 365/185; 365/189.09; 365/189.11
[58] Field of Search ........... 365/184, 185, 104, 230.03, 365/189.09, 189.11; 357/23.5

[56] References Cited

U.S. PATENT DOCUMENTS 4,233,526 11/1980 Kurogi et al. ......................... 365/184
4,404,659 9/1983 Kihara et al. ........................ 365/185
4,933,904 6/1990 Stewart et al. ....................... 365/185

FOREIGN PATENT DOCUMENTS 0071587 5/1982 Japan .................................. 365/185
60-8559 3/1985 Japan.
60-182162 9/1985 Japan.

OTHER PUBLICATIONS

Masuoka et al., "New Ultra High Density EPROM and Flash EEPROM with NAND Cell Structure", IEDM Tech. Dig., Dec. 6-9, 1987, pp. 552-555.
Shirota et al., "A New NAND and Cell for Ultra-High Density 5v-only EEROMs", 1988 Symposium on VLSI Technology, Dig. of Tech. Papers, May 10-13, 1988, pp. 33-34.
E. Adler, IBM Technical Disclosure Bulletin, vol. 27, No. 6, Nov. 1984, S.3302-3307, "Densely Arrayed EEPROM Having Low Voltage Tunnel Write".
Miyamoto et al., "An experimental 5-V-Only 256-kbit CMOS EEPROM with a High-Performance Single Polysilicon Cell", IEEE Journal of Solid-State Circuits, vol. SC21, No. 5, Oct. 1986, pp. 852-860.
Oto et al., "High-Voltage Regulation and Process Considerations for High-Density 5 V-Only E$^2$PROM's", IEEE Journal of Solid-State Circuits, vol. SC-18, No. 5, Oct. 1983, pp. 532-538.
"A High Density EPROM Cell and Array", Symposium of VLSI Technology Digest of Technical Papers; pp. 89-90; May, 1986; R. Stewart et al.

*Primary Examiner*—Glenn Gossage
*Attorney, Agent, or Firm*—Oblon, Spivak, McClelland, Maier & Neustadt

[57] ABSTRACT

An erasable programmable read-only memory with a NAND cell structure including NAND cell blocks, each of which has a selection transistor connected to the corresponding bit line and memory cell transistors connected is series. Word lines are connected to control gates of the cell transistors. In a data write mode, a selection transistor of a certain cell block containing a selected cell is rendered conductive to connect the cell block to the corresponding bit line. A control circuit is provided for applying an "L" Level voltage (approximately 0 V) to a word line connected to the selected cell, applying an "H" level voltage (approximately 20 V) to a word line or word lines positioned between the selected word line and a contact node connecting the cell block and a specific bit line associated therewith, applying a voltage corresponding to data to be written to the specific bit line, and applying an intermediate voltage between the "H" and "L" level voltages to non-selected bit lines, thereby writing the data in the selected cell by tunneling. If the data is logic "0" data, the intermediate voltage is applied also to the specific bit line.

6 Claims, 10 Drawing Sheets

ELECTRICALLY ERASABLE PROGRAMMABLE READ-ONLY MEMORY WITH NAND CELLSTRUCTURE

BACKGROUND OF THE INVENTION

1. Field of the Invention

The present invention relates to non-volatile semiconductor memories and, more particularly, to an electrically erasable programmable read-only memory with a large capacity.

2. Description of the Related Art

With the increasing needs for high performance and reliability of digital computer systems, development of a semiconductor memory with a large capacity which can replace an existing non-volatile data storage device for digital computer systems, such as a magnetic floppy disk unit, has been strongly demanded. A presently-available electrically erasable programmable read-only memory has technical merits such as higher reliability and a higher data write/read rate than those of a magnetic data storage device such as a floppy disk unit or a hard disk unit; however, the data storage capacity of the memory of this type is not so large as to replace the magnetic data storage device.

In a conventional electrically erasable programmable read-only memory (to be referred to as an "EEPROM" hereinafter), each memory cell is typically arranged to include two transistors. Therefore, it cannot be expected to provide a high integration density which can provide a large capacity capable of replacing peripheral data storage devices.

Recently, as a non-volatile semiconductor memory which is highly integrated and therefore has a large capacity, an erasable programmable read-only memory with a "NAND type cell" structure has been developed. A typical arrangement of a memory of this type is proposed in, for example, "A High Density EPROM Cell and Array", Symposium of VLSI Technology, Digest of Technical Papers, R. Stewart et al., May 1986, at p. 89 to 90. According to a memory device of this type, each memory cell consists of one transistor having a floating gate and a control gate, and only one contact portion is formed between an array of memory cells arranged on a substrate to constitute a "NAND cell" structure and the corresponding bit line. Therefore, a cell area with respect to the substrate can be reduced much smaller than that of a conventional EEPROM, thereby improving the integration density thereof.

However, the above EEPROM suffers from a problem of low operational reliability. In each memory cell transistor, a polycrystalline silicon insulative layer is formed between a floating gate and a control gate to insulate the two gates from each other. It is considered that film quality of the polycrystalline silicon insulative layer is much lower than that of a silicon oxide ($SiO_2$) layer deposited on the substrate. Since carriers for data storage form an electric field between the floating and control gates and move therebetween by tunneling through the polycrystalline silicon insulative layer, characteristics of the memory cell in a data writing-/erasing mode are degraded. This results in that it becomes difficult to provide effective data writing/erasing.

SUMMARY OF THE INVENTION

It is therefore an object of the present invention to provide a novel and improved non-volatile semiconductor memory.

It is another object of the present invention to provide a novel and improved electrically erasable programmable read-only memory which is highly integrated to have a large capacity and is superior in operational reliability.

In accordance with the above objects, the present invention is addressed to a specific non-volatile dynamic semiconductor memory device comprising a semiconductive substrate, parallel bit lines formed above the substrate, and rewritable memory cells connected to the bit lines. The memory cells comprise NAND cell blocks, each of which has a series array of memory cell transistors. Each of these cell transistors has a carrier storage layer such as a floating gate and a control gate. Parallel word lines are formed above the substrate to cross the bit lines and are connected to the control gates of the cell transistors. A control circuit is provided for, in a data write mode of the memory device, applying an "L" level voltage to a word line connected to a selected cell of a cell block, applying an "H" level voltage to a word line or word lines which are positioned between the selected word line and a contact node between the cell block and a specific bit line associated therewith, applying a voltage corresponding to data to be written to the specific bit line, and applying an intermediate voltage lower than the "H" level voltage and higher than the "L" level voltage to non-selected bit lines, whereby the above selected memory cell transistor is rendered nonconductive, so that the data is written by tunneling in the selected memory cell. If the data to be written is logic "0" data, the intermediate voltage is applied to the above specific bit line.

The present invention and its objects and advantages will become more apparent in a detailed description of preferred embodiments to be presented below.

BRIEF DESCRIPTION OF THE DRAWINGS

In the detailed description of preferred embodiments of the invention presented below, reference is made to the accompanying drawings of which.

DETAILED DESCRIPTION OF THE PREFERRED EMBODIMENTS

Figure 1:
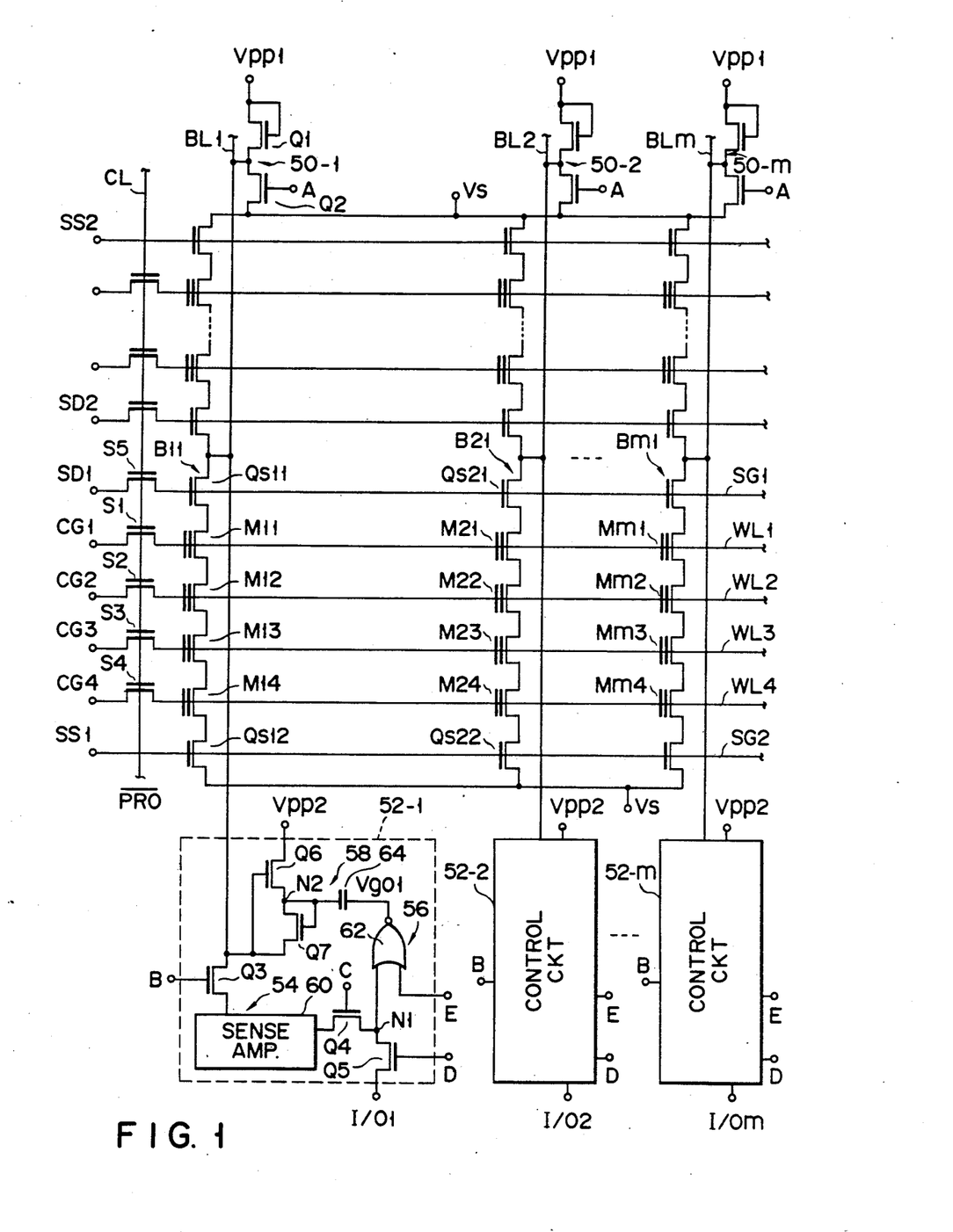
FIG. 1 is a diagram showing a main part of a circuit arrangement of an electrically erasable programmable read-only memory in accordance with a preferred embodiment of the present invention.
Figure 2:
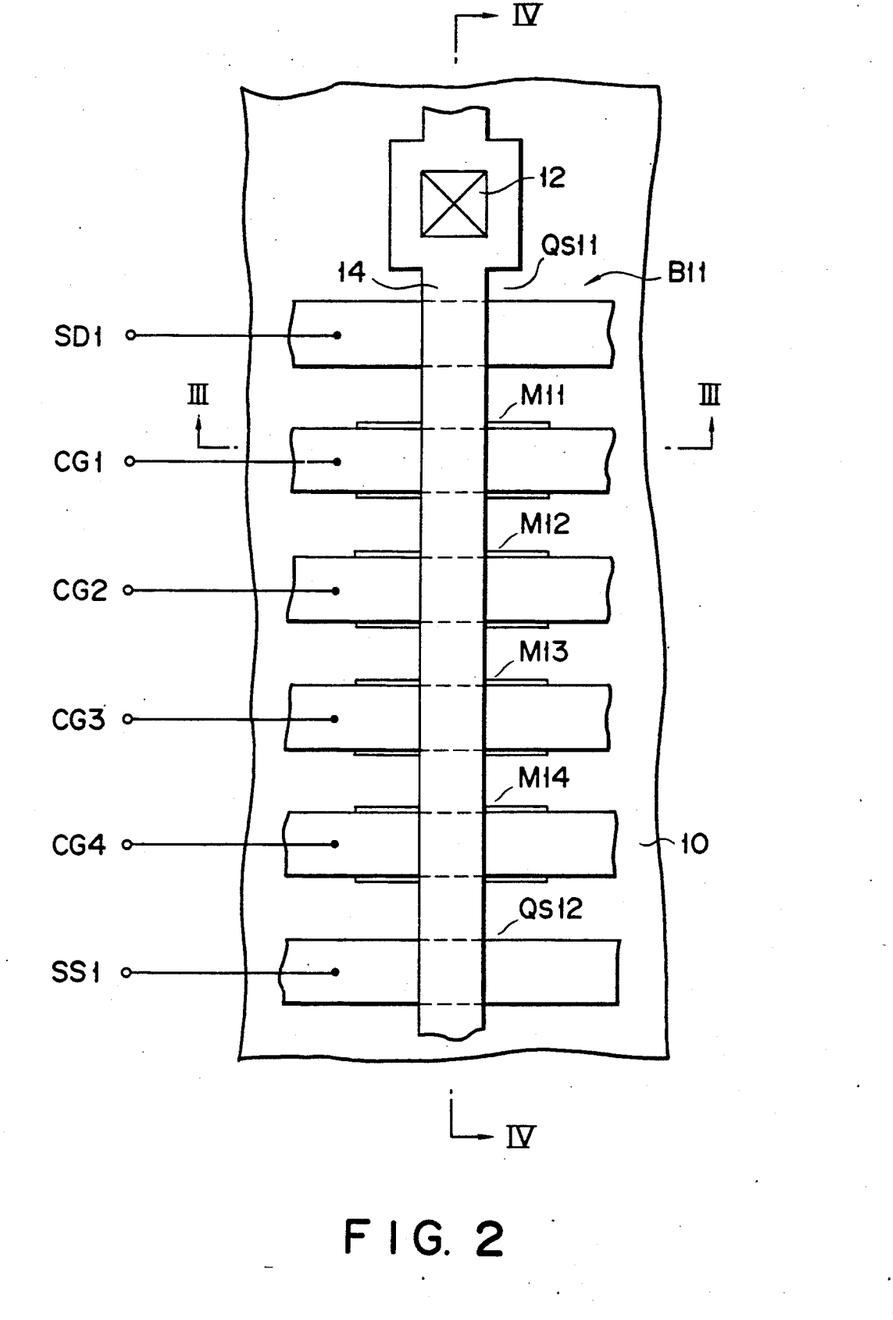
FIG. 2 is a diagram showing a plan view of a NAND cell block provided in the EEPROM of FIG. 1 and including memory cell transistors connected in series with each other to constitute a "NAND cell structure" together with a selection transistor.

Referring now to FIG. 1, an electrically erasable programmable read-only memory according to a preferred embodiment of the present invention has a cell array section, which is formed above chip substrate 10 (see FIG. 2). A selected number of parallel bit lines BL1, BL2, ..., BLm (reference symbol "BLi" is used to denote an arbitrary one of the bit lines hereinafter) are insulatively formed above the substrate. Each of these bit lines BLi is connected with a plurality of memory cells. The cells are divided into subarrays (to be referred to as "NAND cell blocks" or as simply "cell blocks" hereinafter) B11, B12, ..., (reference symbol "Bij" is used to denote an arbitrary one of the cell blocks), each of which has selection transistors Qs11 and Qs21, ... and a predetermined number of memory cells M. Selection transistors Qs are constituted by single gate type MOSFETs. Each of memory cells M is basically constituted by a double gate type MOSFET which has a floating gate and a control gate.

A series array of transistors of each NAND cell block Bij is connected at its one end (i.e., the drain of memory cell transistor M11) to corresponding bit line BLi through first selection transistor Qsi1, and is grounded at the other end (i.e., the source of memory cell transistor M14) to substrate voltage Vs through second selection transistor Qsi2. In this embodiment, memory cells M of each cell block Bij consist of memory cell transistors Mi1, Mi2, ..., Min connected in series with each other to constitute a so-called "NAND cell" structure. In the following description, the number "n" of memory cell transistors included in each cell block is set to be small number "4" only for the sake of illustrative simplicity. The number will be, however, set to be "8" or "16" in an actual application.

Parallel word lines WL1, WL2, ..., WL4 are insulatively formed above the substrate so as to cross bit lines BL. Selection transistors Qs and memory cell transistors M are connected to nodes of bit lines BL and word lines WL as shown in FIG. 1, respectively, thereby constituting a cell matrix. Note that lines SG1 and SG2 connected to selection transistors Qs1 and Qs2 of each cell block Bij, respectively, are sometimes called "gate control lines" in this description.

As shown in FIG. 2, one NAND cell block (e.g., "B11") has contact hole 12 above lightly-doped P type silicon chip substrate 10. More specifically, connection line (aluminum wiring) 14 serving as a bit line insulatively extends above a series connection of transistors Qs and M. Wiring 14 overlaps the gates of transistors Qs and M included in cell block B11.

Figure 3:
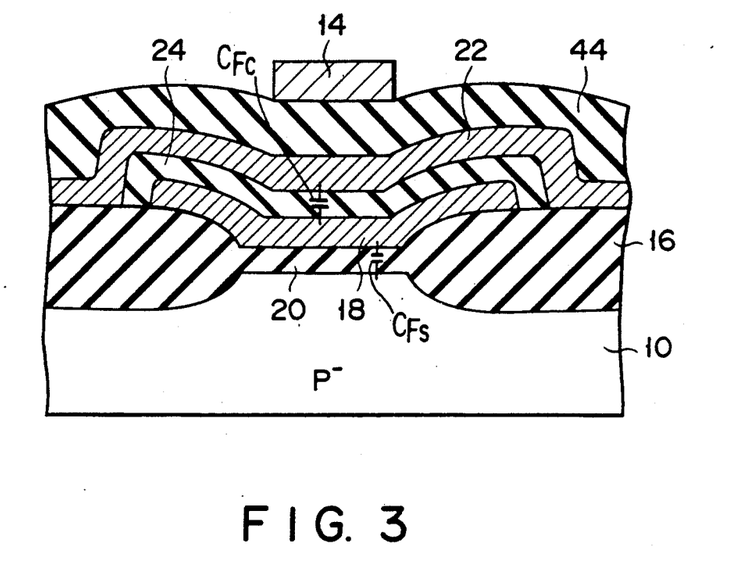
FIG. 3 is a diagram showing a sectional arrangement of the NAND cell block in FIG. 2 taken along line III—III thereof.
Figure 4:
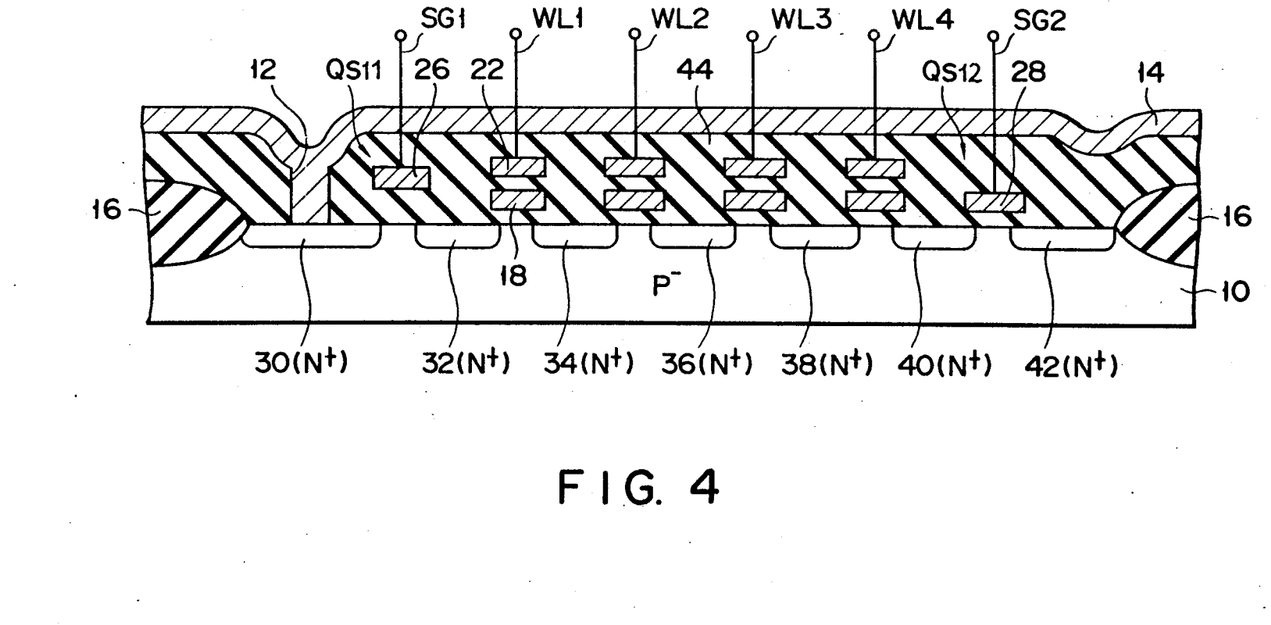
FIG. 4 is a diagram showing a sectional arrangement of the NAND cell block in FIG. 2 taken along line IV—IV thereof.

Referring to sectional views of FIGS. 3 and 4, the transistor array of NAND cell block B11 is formed on a substrate surface area surrounded by insulative layer 16, formed on substrate 10, for isolating elements. As is most clearly shown in FIG. 3, MOSFET M11 constituting one memory cell (the other memory cells have the same arrangement) has first polycrystalline silicon layer 18 insulatively disposed above substrate 10 by thermal oxide insulative layer 20 and second polycrystalline silicon layer 22 insulatively disposed above layer 18 by thermal oxide insulative layer 24. Layer 18 serves as a floating gate of MOSFET Mij, whereas layer 22 serves as a control gate of MOSFET Mij. Control gate layer 22 is connected to the corresponding word line (in the case of memory cell M11, word line WL1). As shown in FIG. 3, floating gate 18 extends onto the element isolation region, whereby in each cell Mi, coupling capacitance Cfs between floating gate 18 and substrate 10 is set smaller than coupling capacitance Cfc between floating gate 18 and control gate 22, so that data writing/erasing is enabled by only movement of electrons by a tunneling effect between floating gate 18 and substrate 10.

First selection transistor Qs11 has polycrystalline silicon layer 26 insulatively disposed above substrate 10. Layer 26 serves as a gate of selection transistor Qs11. Similarly, second selection transistor Qs12 has polycrystalline silicon layer 28 insulatively disposed above substrate 10, which serves as a control gate of selection transistor Qs12.

As shown in FIG. 4, heavily-doped N type diffusion layers 30, 32, 34, 36, 38, 40, and 42 are formed to slightly overlap the gates of transistors Qs and M. N+ diffusion layers serve as sources and drains of the corresponding transistors. For example, layers 30 and 32 serve as the drain and source of selection transistor Qs11. Similarly, layers 32 and 34 serve as the drain and source of cell transistor M11.

The above layer structure is entirely covered with CVD insulative layer 44. As shown in FIG. 4, a through hole is formed in layer 44 so as to serve as contact hole 12 for a series transistor array. Hole 12 is located on drain diffusion layer 30 of selection transistor Qs11. Aluminum wiring layer 14 runs on layer 44 and contacts drain diffusion layer 30 of transistor Qs through contact hole 12. Layer 14 is selectively connected to a data input or output line.

Referring back to FIG. 1, word lines WL1, WL2, WL3, and WL4 are connected to control terminals CG1, CG2, CG3, and CG4 through selection transistors S1, S2, S3, and S4, respectively. Gate control line SG1 is connected to control terminal SD1 through selection transistor S5. Line SG2 is directly connected to control terminal SS1. Transistors S1 to S5 are connected at their gates to control line CL. Control signal $\overline{PRO}$ is supplied to line CL.

Each of bit lines BLi is connected at one end to intermediate voltage generator 50-i and is connected at the other end to peripheral control circuit 52-i. Generator 50 includes a series-circuit of two MOSFETs Q1 and Q2. The gate of FET Q1 is connected to its drain. FET Q1 is applied with first boosted voltage Vpp1 (in this embodiment, 10 volts) at its drain. Therefore, voltage Vpp1 is applied to bit line BL1 through FET Q1. FET Q2 has a gate connected to terminal A. FET Q2 serves as a discharging transistor through which bit line carriers are discharged.

Peripheral control circuit 52 includes sense circuit section 54, data discriminating circuit section 56, and write control circuit section 58. Sense circuit section 54 has MOSFET Q3 having a gate connected to terminal B and turned on in a read mode of the EEPROM, sense amplifier 60 connected to bit line BL1 through FET Q3, MOSFET Q4 having a gate connected to terminal C, connected to the output of amplifier 60, and turned on in the read mode of the EEPROM, and MOSFET Q5 having a gate connected to terminal D and connected between FET Q4 and input/output line I/O1. Data discriminating circuit section 56 includes NOR gate 62 having a first input connected to common node N1 of FETs Q4 and Q5 and a second input connected to terminal E. Write control circuit section 58 includes a series circuit of two MOSFETs Q6 and Q7 and capacitor 64 connected to the output of NAND gate 62. FET Q6 is applied with second boosted voltage Vpp2 (in this embodiment, 20 volts) at its drain. The gate of FET Q6 is connected to the source of FET Q7 and bit line BL1. The gate of FET Q7 is connected to common node N2 of FETs Q6 and Q7. Node N2 is connected to the output of NOR gate 62 through capacitor 64. Diode-connected FET Q7 and capacitor 64 constitute a so-called "pumping circuit". FETs Q6 and Q7 serve as an "H" level voltage supply circuit for supplying voltage Vpp2 to corresponding bit line BL1 in accordance with an output signal from data discriminating circuit 56.

Figure 5:
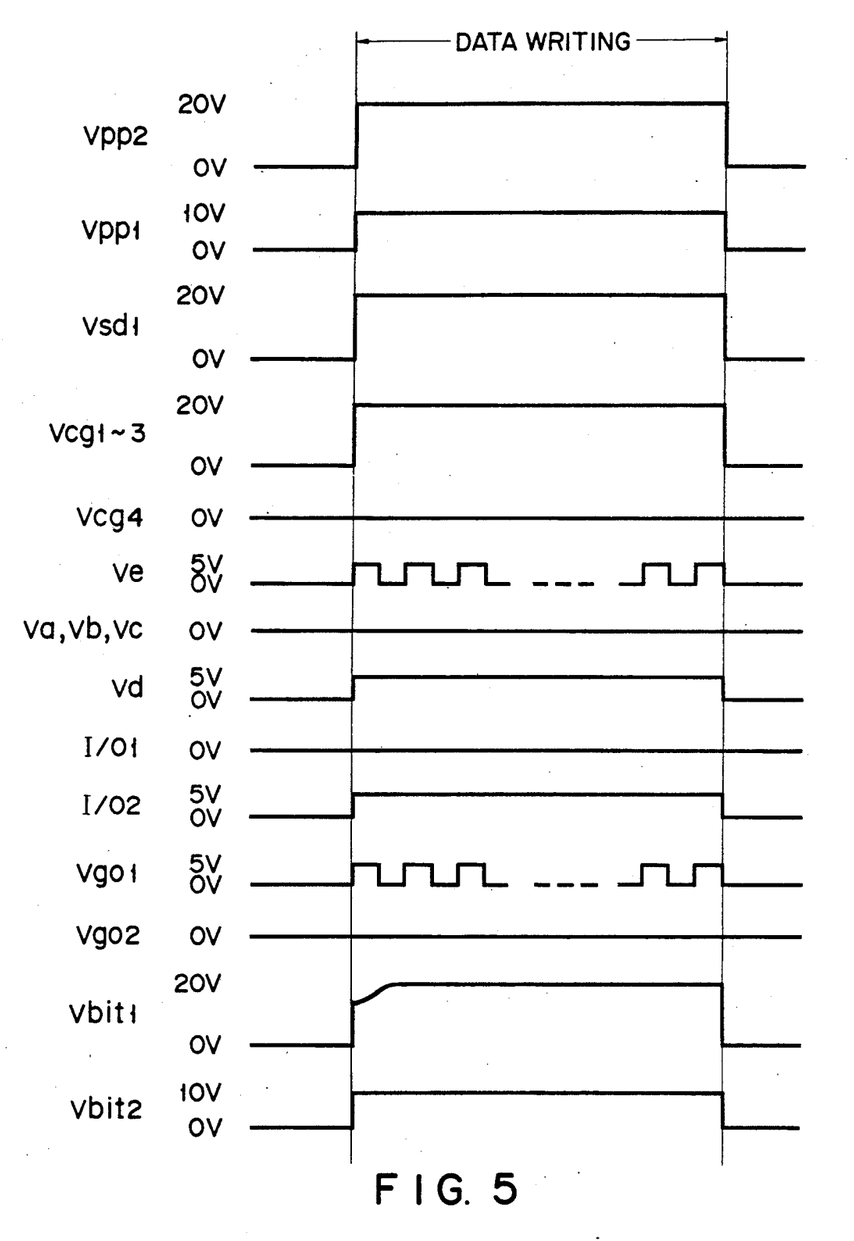
FIG. 5 is a diagram showing waveforms of main signals generated in main parts of the EEPROM in FIG. 1 in a data write mode.

Operation modes of the EEPROM according to the present invention having the above arrangement will be described below with reference to the timing chart of FIG. 5. In FIG. 5, a voltage on bit line BL is represented by "Vbit", and voltages to be applied on lines SD1, SD2, and CG1 to CG4 are represented by "Vsd1", "Vsd2", "Vcg1", "Vcg2", "Vcg3" and "Vcg4", respectively. Voltages generated at terminals A, B, C, D and E of intermediate voltage generator 50 and peripheral control circuit 52 are represented by "Va", "Vb", "Vc", "Vd" and "Ve", respectively. An output voltage from NOR gate 62 of peripheral control circuit 52-i is represented by "Vgoi". For example, output voltages from NOR gates 62 of circuits 52-1 and 52-2 are represented by "Vgo1" and "Vgo2", respectively.

The EEPROM performs simultaneous data erasing for all the memory cells (the EEPROM of the present invention is therefore called a "flash EEPROM"). At this time, data stored in all cell transistors M included in each cell block are simultaneously erased in the manner to be described below. That is, the "H" level voltage, such as 20 volts, is applied to all word lines WL1 to WL4. Simultaneously, the "H" level voltage is applied to terminals, SS1 and A. As a result, a channel is formed in each of all the memory cells. The channel has ground voltage Vs, whereby electrons are injected from substrate 10 to floating gate 18. At this time, a threshold value of each of the memory cell transistors is shifted in a positive direction so as to be, e.g., about 2 volts, thereby setting a data "0" storage state. In this manner, the simultaneous erasing operation is completed in the EEPROM.

In a data write mode, the "L" level voltage, such as 20 volts, is applied to a selected word line, and the "H" level voltage is applied to a nonselected word line or word lines positioned between the selected word line and the first selection transistor serving as a contact node between the cell block and a specific bit line associated therewith. The "H" level voltage or an intermediate voltage between the "L" and "H" level voltages (such as 9 volts) is applied to the selected bit line in accordance with a binary value of digital data to be stored. At this time, in order to prevent over-erasing, the intermediate voltage is applied to the nonselected bit lines.

More specifically, assume that data is to be written in, e.g., memory cell M14 of the memory cell matrix in FIG. 1 (for the sake of simplicity, operations of only two neighboring bit lines, i.e., line BL1 as a selected bit line and line BL2 as a nonselected bit line will be described below: other nonselected bit lines BL3, . . . , BLm are similar to bit lines BL2). Signal $\overline{PRO}$ is supplied to line CL, and FETs S1 to S5 are turned on. When voltage Vsd1 to be applied to terminal SD1 rises to 20 volts as shown in FIG. 5, selection transistors Qs11 and Qs21 are turned on, thereby electrically connecting each of NAND cell blocks B to corresponding bit line BL. If memory cell M14 is a selected cell, word line WL4 and bit line BL1 are selected. 0 volts is applied as the "L" level voltage to terminal CG4 of selected word line WL4, whereas 20 volts is applied as the "H" level voltage to terminals CG1 to CG3 of remaining word lines WL1 to WL3 and terminal SD1 of gate control line SG1. When the data write operation is started, first boosted voltage Vpp1 is increased. Also, terminals B and C of FETs Q3 and Q4, which are turned on only in the read mode, and gate terminal A of FET Q2, which is turned on only in the erase mode, are maintained at the "L" level voltage.

With such a voltage application, about 8 volts which is a voltage lower than voltage Vpp1 by the threshold value of FET Q1 is supplied to selected bit line BL1 and nonselected bit line BL2 (similarly to the other nonselected bit lines). Meanwhile, the voltage of I/O line I/O1 of bit line BL1 becomes 0 volts, the voltage of I/O line I/O2 of bit line BL2 becomes 5 volts, and voltage Vd of 5 volts is applied to gate terminal D of writing FET Q5 of each of control circuits 52-1 and 52-2, thereby turning on FETs Q5. Therefore, NOR gate 62 of circuit 52-1 receives at its first input data supplied from line I/O1 and receives at its second input output voltage Ve (see FIG. 5) from a ring oscillator supplied from terminal E. Similarly, NOR gate 62 of circuit 52-2 receives at its first input data supplied from line I/O2 and receives at its second input the output voltage Ve from the ring oscillator supplied from terminal E. Since voltage Ve is applied, an output voltage (Vgo1) of NOR gate 62 of circuit 52-1 of line BL1 is increased to turn on FET Q7. In response to the turn-on operation of FET Q7, FET Q6 is turned on. As a result, second boosted voltage Vpp2 (=20 volts) is applied to bit line BL1. Therefore, control gate voltages Vcg1, Vcg2 and Vcg3 of memory cell transistors M11 to M13 of bit line BL1 are set to be 20 volts as shown in FIG. 5. Since the channels of transistors M are rendered conductive and the "H" level voltage of 20 volts is applied to bit line BL, no carrier moves in memory cells M11 to M13, and no data voltage change occurs. In memory cell M14, control gate voltage Vcg4 is at 0 volts, and its drain 38 (see FIG. 4) is applied with substantially 20 volts (the voltage is actually slightly lower than that because a slight voltage drop occurs in the channels of these transistors) through cell transistors M11 to M13 being rendered conductive. Therefore, electrons stored or accumulated in floating gate 18 of memory cell M14 are discharged by tunneling to substrate 10. As a result, the threshold value of memory cell transistor M14 is shifted in a negative direction to be, e.g., $-3$ volts. In this manner, the writing of logic data "1" is completed.

Since the output voltage of NOR gate 62 of control circuit 52-2 is fixed to the "L" level voltage during data write in selected bit line BL1, the intermediate voltage of 8 volts is applied to nonselected bit line BL2 by circuit 50-2. Therefore, over-erasing in nonselected memory cells M21 to M24 can be reliably prevented. The reason for this is as follows. That is, assume that bit line BL2 is set at the "L" level voltage ($=0$ volts). In this case, since word lines WL1 to WL3 are at the "H" level voltage, memory cells M21 to M23 connected thereto are automatically set in a data erase mode. As a result, the threshold values of memory cells M21 to M23 set in the data "0" storage state, because their threshold values are initially, e.g., 2 volts, are undesirably shifted in the positive direction to be, e.g., 6 volts. This state is known as an "over-erasing state". When the EEPROM is subjected to the data read mode, in order to read data "0" at the threshold value of 2 volts or data "1" at the threshold value of $-3$ volts, 0 volts is applied to a word line connected to certain selected memory cell Mij, and 5 volts is applied to nonselected word lines. All memory cells M except for those of the selected word line are turned on, and it is therefore difficult to perform an effective data read.

The following Table summarizes the voltages applied to memory cells M11 to M14 of selected bit line BL1 in the data write mode of the EEPROM and memory cells M21 to M24 of nonselected bit line BL2.

|  | Control Gate Voltage | Drain Voltage |
|---|---|---|
| Selected Cell M14 of Selected Bit Line BL1 | 0 V | 20 V |
| Nonselected Cells M11 to M13 of Selected Bit Line BL1 | 20 V | 20 V |
| Cell M24 of Nonselected Bit Line BL2 | 0 V | 8 V |
| Cells M21 to M23 of Nonselected Bit Line BL2 | 20 V | 8 V |

In the data read mode, if memory cell M14 is selected, a voltage of 0 volts is applied to word line WL4 connected to selected cell M14, and a voltage of 5 volts is applied to the remaining word lines WL1 to WL3, to thereby detect whether selected cell M14 is turned on while nonselected memory cells M11 to M13 are turned on. If cell M14 is turned on, the storage data is discriminated to be "1". If cell M14 is kept off, the storage data is discriminated to be "0". If "over-erasing" as described above occurs in the EEPROM, the threshold value of the memory cell is increased, and it becomes difficult or impossible to turn on memory cells connected in series with the selected cell under the above read conditions. According to this embodiment, however, the nonselected bit lines are kept at the intermediate voltage between the "H" and "L" level voltages during data write in the selected cell. Therefore, the above drawback can be reliably eliminated. Furthermore, the reduction of the BL voltage (Vpp) is suppressed due to the increment in the threshold voltage Vth of nonselected cells, which results in that the data writing operation can be made easier.

In addition, as shown in FIG. 1, the gate and drain of FET Q1 for supplying first boosted voltage Vpp1 are commonly connected. Therefore, when second boosted voltage Vpp2 higher than voltage Vpp1 is applied to bit lines BL, a series path is prevented from being formed at the voltage Vpp1 side.

Figure 6:
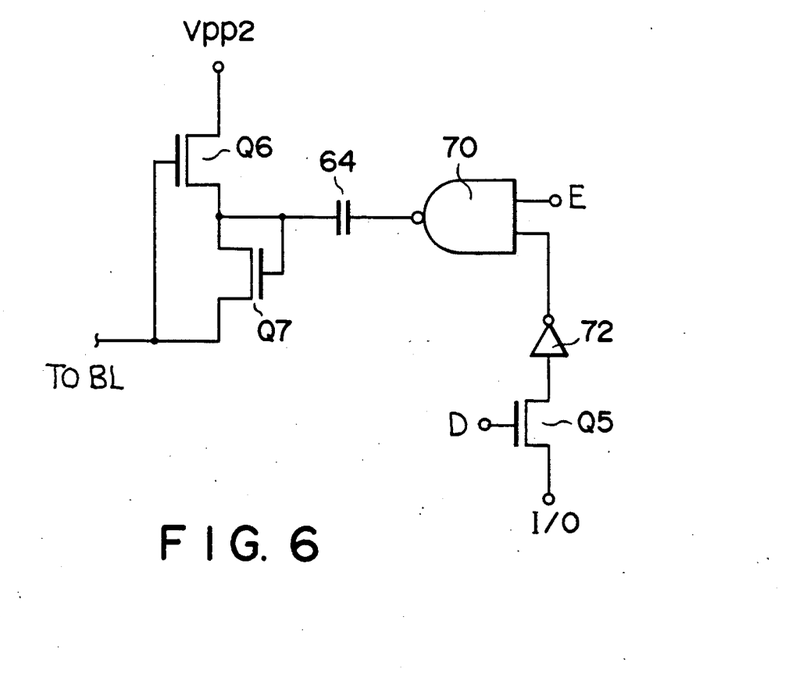
FIG. 6 is a diagram showing a modified circuit arrangement of a peripheral control circuit of the EEPROM in FIG. 1.

As shown in FIG. 6, NOR gate 62 of control circuit 52 may be replaced with a series circuit consisting of NAND gate 70 and inverter 72. In addition, in the above embodiment, first boosted voltage Vpp1 is used as the intermediate voltage to be applied to nonselected bit lines BL. However, the intermediate voltage need only have a voltage intermediate between the "H" and "L" level voltages.

Figure 7:
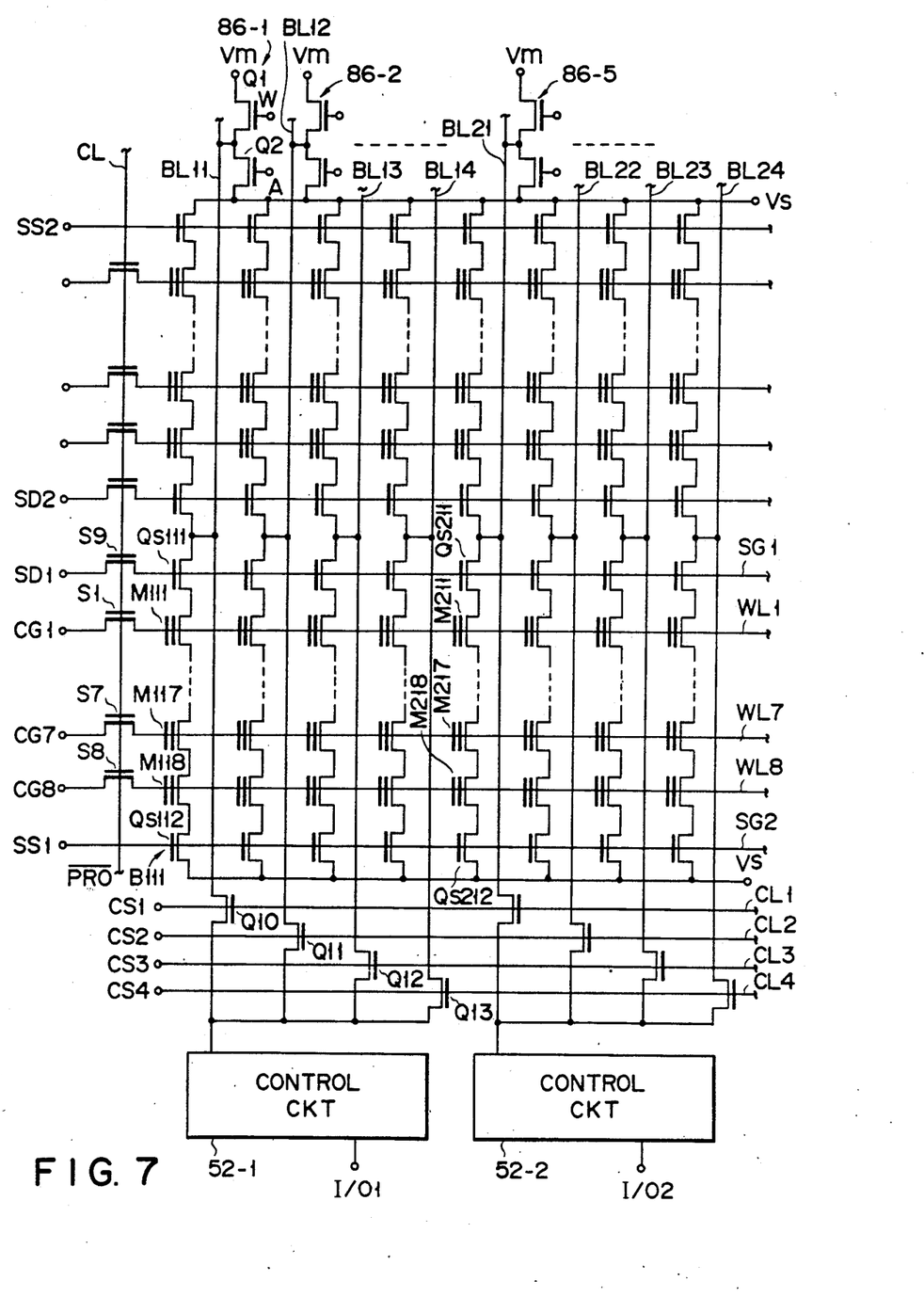
FIG. 7 is a diagram showing a main part of a circuit arrangement of an EEPROM according to another embodiment of the present invention.

Referring now to FIG. 7, an electrically erasable programmable read-only memory according to the second embodiment of the present invention can be operated by using a single power source voltage of 5 volts. A selected number of, e.g., four (in this embodiment) bit lines BLi1 to BLi4 are connected to peripheral control circuit 52-i (the arrangement of the control circuit is the same as that of the above embodiment and a detailed illustration thereof is omitted in FIG. 7) through N channel MOSFETs Q10, Q11, Q12 and Q13, respectively. MOSFETs Q10, Q11, Q12 and Q13 are connected at their gates to column control lines CL1, CL2, CL3 and CL4, respectively. Lines CL1, CL2, CL3 and CL4 have terminals CS1, CS2, CS3 and CS4 for receiving column address signals. Address signals CS1 to CS4 are supplied to the gates of FETs Q10 to Q13 formed between each group of four bit lines BLi1 to BLi4 and corresponding circuit 52-i through signal lines CL1 to CL4, respectively.

Figure 8:
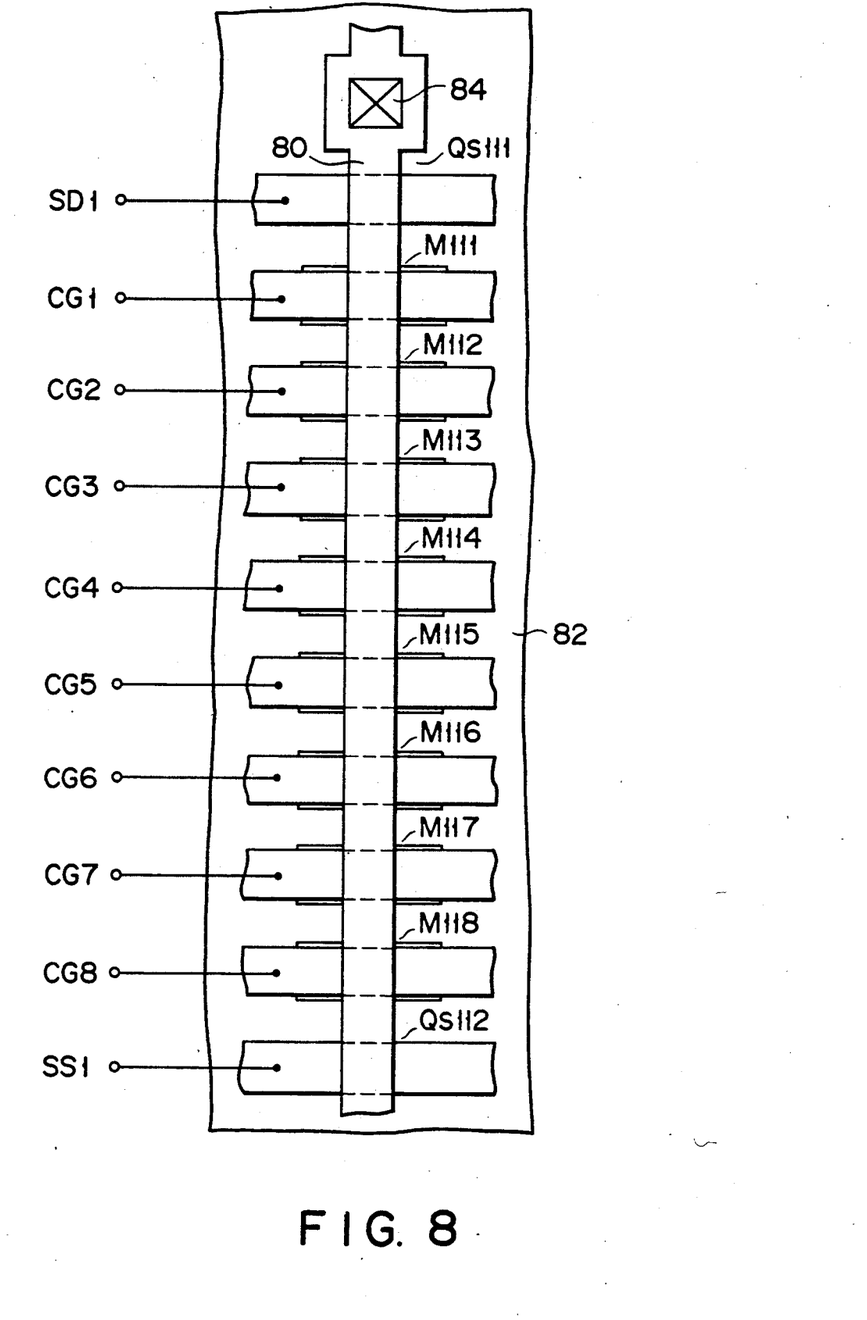
FIG. 8 is a diagram showing a plan view of a NAND cell block provided in the EEPROM of FIG. 7 and including memory cell transistors to be connected in series with each other to constitute a "NAND cell structure" together with a selection transistor.

As shown in FIG. 8, each NAND cell block has eight memory cells M, a sectional structure of each of which is similar to that of the above embodiment. Elongated aluminum layer 80 serving as bit line BL is insulatively deposited above chip substrate 82. Layer 80 is electrically connected to substrate 10 through contact hole 84 in the manner shown in FIG. 4 of the above embodiment. As shown in FIG. 8, memory cell transistors M111 to M118 are sequentially arranged along line 80. Similar to the above embodiment, first and second selection transistors Qs111 and Qs112 are connected at both ends of an array of the memory cell transistors. Word lines serving as control gate electrodes of transistors M111 to M118 are connected to terminals CG1 to CG8, respectively. Gate control wirings serving as gate electrodes of selection transistors Qs111 and Qs112 are connected to terminals SD1 and SS1, respectively.

Referring back to FIG. 7, word lines WL1 to WL8 are connected through selection transistors S1 to S8 consisting of depletion-type N channel MOSFETs (illustration of FETs S2 to S6 is omitted in FIG. 7 for the sake of illustrative simplicity) to control line CL to which a control signal $\overline{PRO}$ is supplied. Line SG1 is connected to terminal SD1 through selection transistor S9, whereas line SG2 is directly connected to terminal SS1. Each bit line BLi is connected to intermediate voltage supply circuit 86-i consisting of a series circuit of N channel type MOSFETs Q1 and Q2. FET Q1 is switched in response to write signal W supplied to its gate. FET Q2 is switched in response to erase signal A supplied to its gate. The drain terminal of FET Q1 is applied with internal boosted voltage Vm (e.g., 10 volts). The source terminal of FET Q2 is connected to substrate ground voltage Vs.

According to the EEPROM of the second embodiment of the present invention having the above arrangement, a voltage of 20 volts is applied as the "H" level voltage to all word lines WL in the simultaneous erase mode. At the same time, a voltage of 20 volts is applied as the "H" level voltage to gate control lines SG1 and SG2 of first and second selection transistors Qs. A voltage of 5 volts is applied to the gate of FET Q2 of intermediate voltage supply circuit 86-i of each bit line BLi. Voltages of address lines CL1 to CL4 are set to be 0 volts. Substrate voltage Vs is 0 volts in any of the erase, write and read modes of the EEPROM.

With such a voltage application, channels are formed in all memory cells M of the EEPROM, a channel voltage becomes a ground voltage, and their control gates obtain an "H" level voltage. As a result, in all memory cells M, electrons are simultaneously transferred (tunnel current flows) from substrate 82 to the floating gates by Fowler-Nordheim tunneling (known as "F-N tunneling"), whereby the threshold value of each memory cell Mi is shifted in a positive direction to be, e.g., 2 volts. This state corresponds to a "0" state. In other words, in the simultaneous erase mode, all memory cells M are initialized to be a data "0" storage state.

Figure 9:
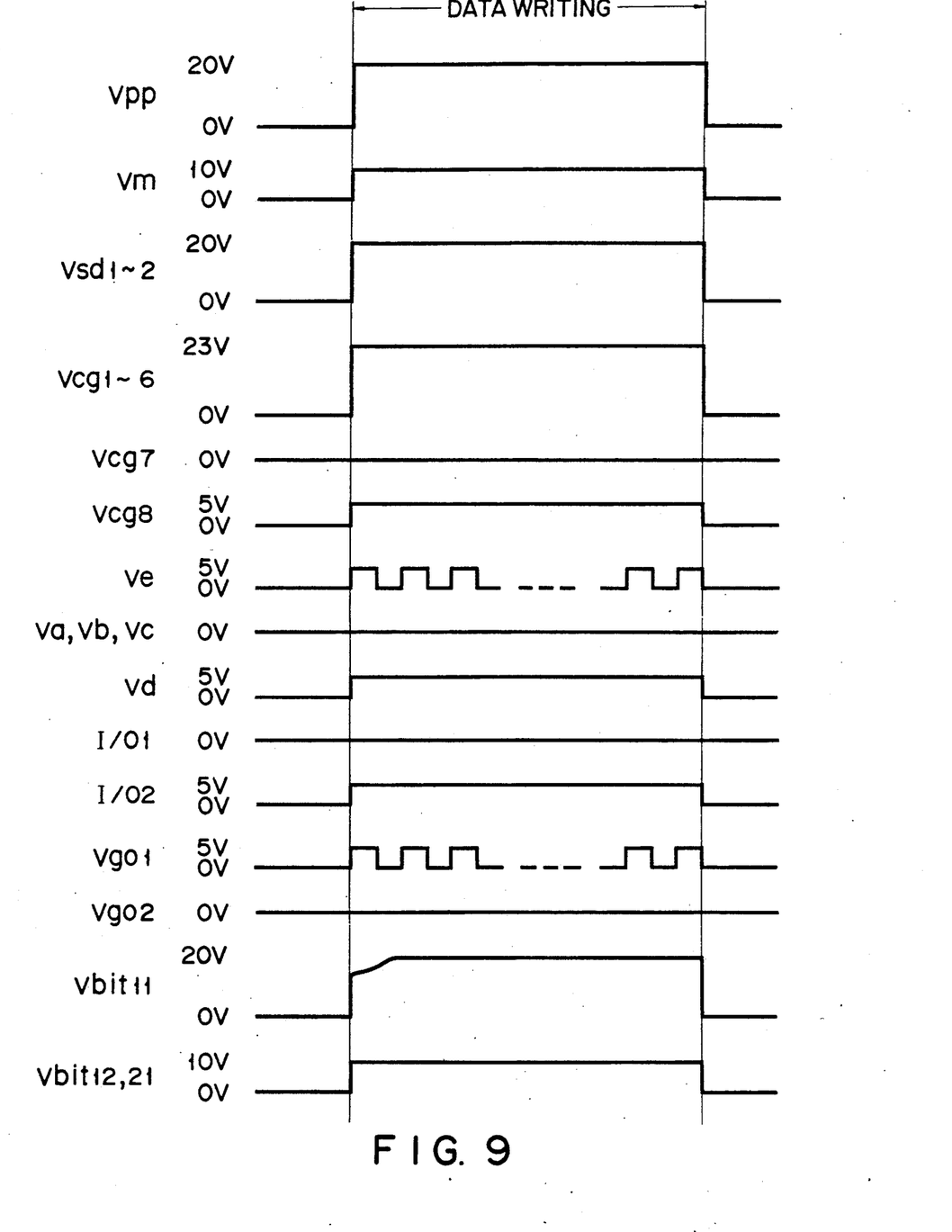
FIG. 9 is a diagram showing waveforms of main signals generated in main parts of the EEPROM in FIG. 7 in a data write mode.

Referring to FIG. 9, a data write operation of the EEPROM will be described below. When a write mode is set and, e.g., memory cell M117 is selected, an "L" level voltage is applied to word line WL7 connected to selected memory cell M117. At this time, an "H" level voltage or intermediate voltage, which has a voltage intermediate between the "H" level voltage and ground voltage Vs, is applied to selected bit line BL11 in correspondence with logic data to be written in the selected memory cell. The intermediate voltage is applied to nonselected bit lines BL12 to BL14, and BL21 to BL24. Therefore, as shown in FIG. 9, control gate terminal voltages Vcg1 to Vcg6 of nonselected memory cells M111 to M116 of NAND cell block B111 are set to be 23 volts during the write mode. Control gate terminal voltage Vcg7 of selected memory cells M117 is maintained at 0 volts. Control gate terminal voltage Vcg8 of nonselected memory cell M118 is set to be 5 volts.

More specifically, when the write operation is started, voltage Vsd1 of control gate line SG1 connected to selection transistor Qs111 and voltage Vsd2 are set to be the "H" level voltage (=20 volts), as shown in FIG. 9, whereby first selection transistor Qs111 of selected bit line BL1 is rendered conductive. Therefore, NAND cell block B111, together with the remaining NAND cell blocks, is connected at its one end to bit line BL11. Similarly, voltage Vss1 of control gate line SG2 is set to be the "H" level voltage (=20 volts), whereby second selection transistor Qs112 of selected bit line BL11 is rendered conductive. Therefore, NAND cell block B111 is connected at its other end to substrate ground voltage Vs. This also applies to the remaining NAND cell blocks. When the write mode is started, the gate voltage of FET Q1 of intermediate voltage supply circuit 86 of each bit line BLi is initially at a voltage (Vm+Vth) which is a sum of internal boosted votage Vm (=10 volts) and FET threshold value Vth.

As shown in FIG. 9, gate voltage Va of FET Q2 of each intermediate voltage supply circuit 86-i and gate voltages Vb and Vc of FETs Q3 and Q5 (see FIG. 1) of each peripheral control circuit 52-1 are set to be the "L" level voltage. Therefore, internal boosted voltage Vm is supplied to bit lines BL11, BL12, BL13, BL14, BL21, BL22, BL23, BL24, etc. Considering one group of four bit lines BL11 to BL14 including selected memory cell M117, if control line CS1 is designated in response to the address signal and this bit line group has a voltage (=23 volts) represented by "Vpp (20 volts)+Vth", transistor Q10 is selected and turned on from bit line selection transistors Q10 to Q13 formed in this bit line group, whereby control circuit 52-1 is connected to only selected bit line BL11. A data voltage of 0 volts is applied to I/O line I/O1, and that of 5 volts is applied to I/O line I/O2. In this case, voltage Vpp is applied only to bit line BL11; voltage Vm is applied to the remaining bit lines BL12 to BL24.

In the same manner as in the above-mentioned embodiment, voltage Vd of gate terminal D of write transistor Q5 (see FIG. 1) of each of control circuits 52-1 and 52-2 is set to be 5 volts as shown in FIG. 9, thereby turning on transistors Q5. Therefore, on one input of NOR gate 62 (see FIG. 1) of circuit 52-1 is applied the data voltage (=0 volt, for example) of line I/O1 and on the second input a ring oscillator output signal (represented by "Ve" in FIG. 9) is externally supplied from terminal E. Similarly, on one input of NOR gate 62 (see FIG. 1) of circuit 52-2 is applied the data voltage (=5 volts) of line I/O2 and on the second input ring oscillator output signal Ve is externally supplied from terminal E. In circuit 52-1, since output voltage Vgo1 from NAND gate 62 has a pulse waveform as shown in FIG. 9, carriers are charged to capacitor 64 (see FIG. 1), thereby increasing the gate voltage of FET Q7. Therefore, FET Q7 is turned on, and then FET Q6 is turned on. As a result, boosted voltage Vpp is applied to selected bit line BL11. Upon application of voltage Vpp, FET Q1 of intermediate voltage supply circuit 86-1 is turned off. Meanwhile, since output voltage Vgo2 from NOR gate 62 of control circuit 52-2 is kept at 0 volts as shown in FIG. 9, the above operation is not performed. Therefore, of all bit lines BL, only one bit line BL11 having selected memory cell M117 is applied with voltage Vpp.

With such a voltage application, in NAND cell block B111 of selected bit line BL11, since control gate voltages Vcg1 to Vcg6 of memory cells M111 to M116 are set to be the "H" level voltage of 23 volts, their channels are rendered conductive. At this time, bit line BL11 is applied with the "H" level voltage as described above, so that the drain voltage of each of memory cells M111 to M116 is substantially set to be the "H" level voltage. These memory cells are thus kept unchanged.

The gate of selected memory cell M117 is held at control gate voltage Vcg7 (see FIG. 9) of 0 volts, and its drain is applied with the "H" level voltage of of bit line BL11 through memory cells M111 to M116; memory cell M117 is turned off. Therefore, electrons stored in the floating gate are discharged by F-N tunneling to the diffusion layer of memory cell M117, and the threshold value is shifted in the negative direction to be, e.g., −3 volts. As a result, logic data "1" is written in memory cell M117. Meanwhile, since the gate of the other memory cell M118 is applied with control gate voltage Vcg8 (see FIG. 9) of 5 volts which is an intermediate voltage between the "H" level voltage and ground voltage Vs, data erasing is prevented.

While selected memory cell M117 is subjected to the data writing, I/O line I/O2 of control circuit 52-2 is set at 5 volts in another group of four bit lines BL21 to BL24. Therefore, as shown in FIG. 9, output voltage Vgo2 of NOR gate 62 is set at 0 volts. Therefore, FETs Q6 and Q7 of circuit 52-2 are kept nonconductive, and no boosted voltage Vpp is output. Selected bit line BL21 of this group, which line is selected simultaneously with bit line BL11 upon activation of control line CL1, is set to be intermediate voltage Vm. This state corresponds to writing of logic "0" data. In other words, when logic data "0" is to be written in the selected memory cell, intermediate voltage Vm is applied to not only the nonselected bit lines but also the selected bit line. Note that the memory cells of nonselected bit lines BL22 to BL24 of this group are kept unchanged similar to the nonselected memory cells of lines BL12 to BL14 of the above group of bit lines BL11 to BL14.

Figure 10A:
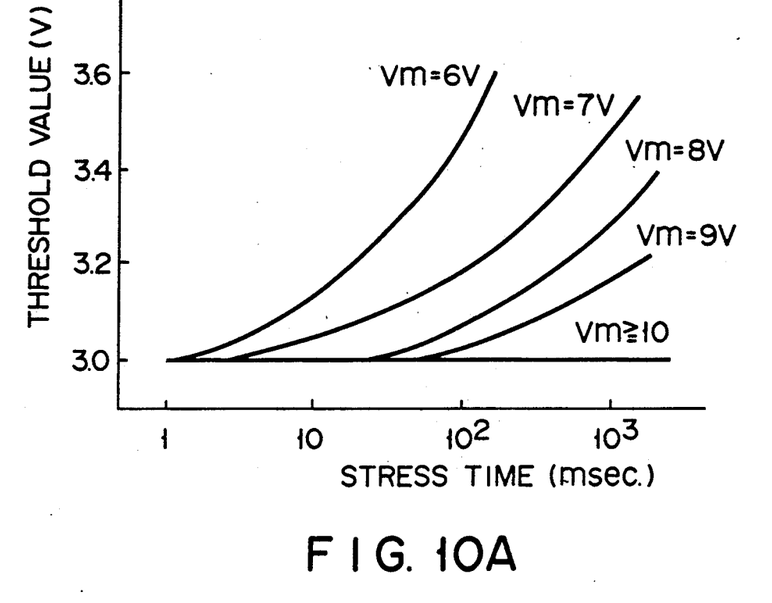
FIGS. 10A and 10B are characteristic graphs showing changes in threshold values of certain memory cells obtained when an intermediate voltage of the EEPROM is changed.
Figure 10B:
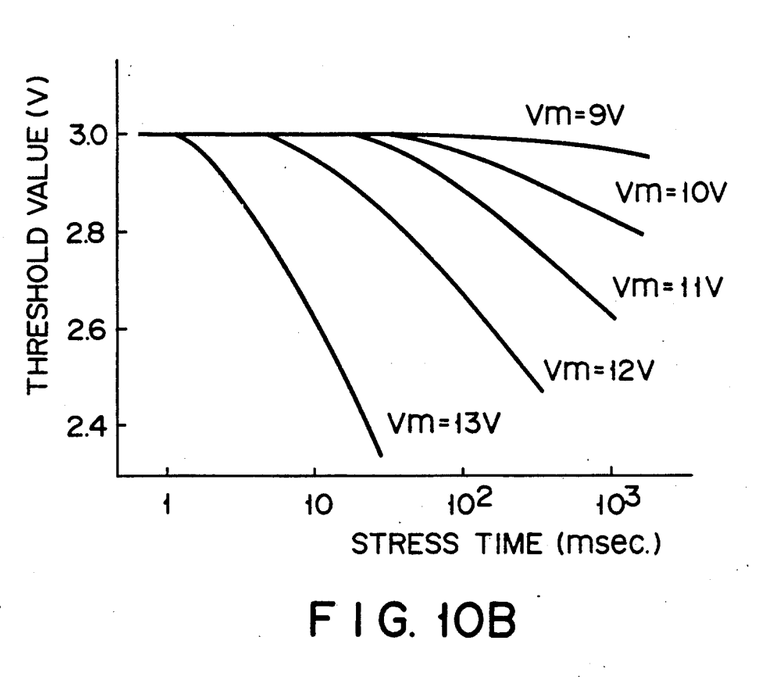

In order to obtain a preferable value of intermediate voltage Vm, the present inventors performed an experiment in which various voltages were applied as the "intermediate voltage Vm" to selected bit line BLi when logic data "0" is to be written. Assume that one of nonselected memory cells M211 to M216 with their gates held at the "H" level voltage of 20 volts when data "0" is to be written is called a "typical nonselected memory cell", and selected memory cell M217 with its control gate held at the "L" level voltage of 0 volts at that time is called a "typical selected memory cell". FIG. 10A shows changes in threshold value with respect to a stress time (voltage application time) of the "typical nonselected memory cell" obtained when the value of intermediate voltage Vm to be applied to bit line BL21 is varied (semiselected injection mode). FIG. 10B shows changes in threshold value with respect to a stress time of the "typical selected memory cell" obtained in the same case (semiselected discharge mode)

As may be understood from FIG. 10A, as intermediate voltage Vm is reduced from 10 volts to reduce the bit line voltage, the change in threshold value of the "typical nonselected memory cell" in the half-selected injection mode is increased. For example, when intermediate voltage Vm was reduced to be 6 volts, the threshold value of the nonselected memory cell largely changed from 3.0 to 3.5 volts while the stress time elapsed only about 100 milli-seconds. On the other hand, as can be understood from FIG. 10B, as intermediate voltage Vm is increased to increase the bit line voltage, the change in threshold value of the "typical selected memory cell" in the semiselected discharge mode is increased. For example, when intermediate voltage Vm was increased to be 13 volts, the threshold value of the selected memory cell largely changed from 3.0 to about 2.6 volts while the stress time elapsed only 10 milli-seconds. From these experimental results, it is concluded that intermediate voltage Vm is preferably set to be 8 to 12 volts when the "H" level voltage of the EEPROM is 20 volts. Therefore, preferable intermediate voltage Vm may be prepresented by the following relation:

$$V_{pp}/2 - 0.1 V_{pp} \leq V_m \leq V_{pp}/2 + 0.1 V_{pp} \quad (1)$$

Since boosted voltage Vpp is 20 volts in this embodiment, the following relation is obtained:

$$8 \leq V_m \leq 12 \quad (2)$$

In this embodiment, Vm = 10 volts.

According to the EEPROM of the second embodiment of the present invention, when data is to be written in a NAND cell block of certain bit line BLi, the order of designation of selected memory cells in the NAND cell block is not limited at all, but the data can be written in a desired memory cell in any order. In addition, in this case, the drains of nonselected memory cells M except for the selected memory cell currently being subjected to data writing are held at intermediate voltage Vm because intermediate voltage Vm is applied to corresponding bit lines BL. Therefore, undesired data erasing or data destruction caused by over-erasing can be reliably prevented. Use of intermediate voltage Vm can reduce a voltage difference between bit lines BL in the data write mode and can reduce possibility of an undesired current leakage by a field transistor. Therefore, operational reliability of the EEPROM can be improved.

Moreover, in this embodiment, if logic data "0" is to be written in the selected memory cell, intermediate voltage Vm is applied also to selected bit line BL. This reliably prevents undesired data erasing/destruction in the nonselected memory cells connected to selected bit line BL in the write mode, thereby improving the operational reliability of the EEPROM.

Furthermore, in this embodiment, all bit lines BL are divided into a plurality of bit line groups each having a predetermined number of bit lines BL. Peripheral control circuit 52 is provided to each group, and selection transistors Q10 to Q13 switched in response to an address signal are provided to the bit lines of each group. When a certain bit line (e.g., BL11) is selected in one group, the corresponding transistor (Q10) is turned on to connect circuit 52 to only a selected bit line. Therefore, a peripheral control circuit arrangement of the chip as a whole can be simplified. This improves a packing density of the EEPROM.

Although the invention has been described with reference to specific embodiments, it shall be understood by those skilled in the art that numerous modifications may be made that are within the spirit and scope of the invention contribution.

Figure 11:
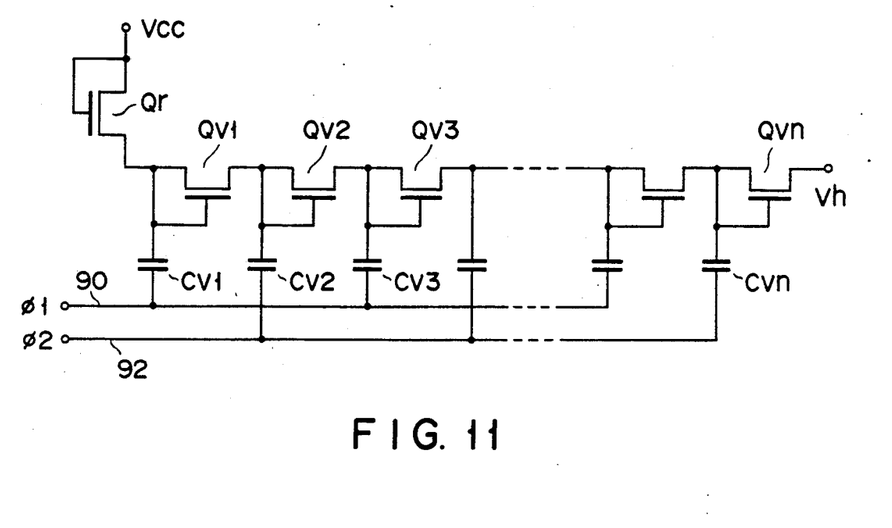
FIG. 11 is a diagram showing a modification of a booster circuit provided in the EEPROM.
Figure 12:
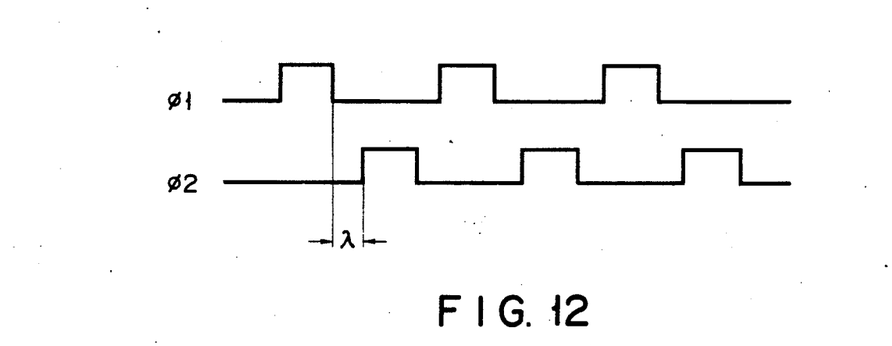
FIG. 12 is a diagram showing waveforms of main signals generated in main parts of the circuit arrangement of FIG. 11.

For example, the EEPROM of the present invention may be modified to have a booster for boosting power source voltage Vcc to generate the "H" level voltage, boosted voltage Vpp or intermediate voltage Vm in the chip. Such a circuit arrangement is shown in FIG. 11. In FIG. 11, a predetermined number of MOSFETs Qv1, Qv2 Qv3, ..., Qvn are connected in series between MOSFET Qr as a load transistor and "H" level voltage output terminal Vh. The gate of each of FETs Qv1, Qv3, ..., Qvn is commonly connected to its drain and is also connected to first clock signal line 90 through a corresponding one of capacitors Cv1, Cv3, ..., Cvn. The gate of each of FETs Qv2, Qv4, ..., is commonly connected to its drain and is also connected to second clock signal line 92 through a corresponding one of capacitors Cv2, Cv4, .... First and second clock signals $\phi1$ and $\phi2$ having waveforms as shown in FIG. 12 are supplied to lines 90 and 92, respectively. Signals $\phi1$ and $\phi2$ are shifted from each other by phase $\lambda$. If power source voltage Vcc is 5 volts, the voltage of 5 volts is applied to capacitor Cv1 when load transistor Qr is turned on, and carriers corresponding to the capacitor are stored. The stored carriers are transferred to next capacitor Cv2 through FET Qv1 using signals $\phi1$ and $\phi2$ and stored therein. Similarly, the stored carriers in capacitor Cv2 are sequentially transferred to next capacitor Cvi, thereby finally obtaining "H" level voltage Vh.

What is claimed is:
1. An erasable programmable read-only memory comprising:
   a semiconductive substrate;

parallel bit lines formed above said substrate;
parallel word lines formed above said substrate and insulated from said bit lines;
field effect transistors formed at intersections of said bit lines and said word lines and functioning as memory cells, said transistors arranged in a cell array which has a series-circuit of cell transistors, and each of said cell transistors including an electrically floating gate layer functioning as a carrier storage layer and a control gate layer connected to a corresponding word line; and
control means connected to said bit lines and said word lines, for applying, when a desired cell is selected from said memory cells of said cell array in a data write mode, an "L" level voltage to a word line connected to the selected cell of said cell array, for applying an "H" level voltage to all word lines positioned between said selected word line and a contact node connecting said cell block to a selected bit line associated therewith, for selectively applying one of the "H" level voltage and an intermediate voltage having a voltage intermediate between the "H" and "L" level voltages to said selected bit line in accordance with logic data to be written to said selected cell, and for applying the intermediate voltage to nonselected bit lines, thereby writing by tunneling the data in said selected cell while preventing over-erasing in nonselected cells;
wherein said control means comprises:
a plurality of intermediate voltage generator means, respectively connected to each of said bit lines, for generating the intermediate voltage which is applied to a corresponding bit line in the write mode; and
high voltage generator means, connected to said bit lines, for detecting whether data to be written in the write mode is logic "1" or logic "0" data, and for generating the "H" level voltage which is applied to said selected bit line, said intermediate voltage generator means connected to said selected bit line being automatically electrically disconnected from said selected bit line when the "H" level voltage is applied.

2. The device according to claim 1, wherein said high voltage generator means comprises:
a plurality of series circuits each having first and second transistors and being respectively connected to said bit lines, said first transistor having a gate electrode connected to a drain electrode thereof and a source electrode connected to the corresponding bit line, said second transistor having a gate electrode connected to the source of said first transistor, a source electrode connected to the drain of said first transistor and a drain to which the "H" level voltage is supplied; and
a capacitor connected to the gate of said first transistor and constituting a pumping circuit together with said first transistor.

3. The device according to claim 1, wherein said intermediate voltage generator means comprises:
a plurality of series circuits each having two transistors and being respectively connected to each of said bit lines, one of said two transistors serving as a charging transistor and connected between the corresponding bit line and the intermediate voltage, and the other of said two transistors serving as a switching transistor connected between the corresponding bit line and a substrate potential.

4. The device according to claim 3, wherein each of said charging transistors has a gate electrode connected to a drain electrode thereof at which the intermediate voltage is supplied.

5. The device according to claim 1, wherein said bit lines are divided into bit line groups each of which consists of a predetermined number of bit lines, and wherein said high voltage generator means comprises:
a plurality of series circuits having first and second transistors respectively connected to said bit line groups, said first transistor having a gate electrode connected to a drain electrode thereof and a source electrode connected to a corresponding bit line, said second transistor having a gate electrode connected to the source of said first transistor, a source electrode connected to the drain of said first transistor and a drain to which the "H" level voltage is supplied;
a capacitor connected to the gate of said first transistor and constituting a pumping circuit together with said first transistor; and
a plurality of switching circuit means, respectively connected between said plurality of series circuits having first and second transistors and said bit line groups, for selectively connecting, when one bit line is designated as said selected bit line from said bit lines, only said selected bit line to one of said series circuits having first and second transistors.

6. The device according to claim 5, wherein said switching circuit means comprises a plurality of transistors respectively connected between said plurality of series circuits and said bit line groups.

* * * * *